(12) United States Patent
John et al.

(10) Patent No.: US 9,105,678 B2
(45) Date of Patent: Aug. 11, 2015

(54) SEMICONDUCTOR DEVICES WITH RECESSED BASE ELECTRODE

(71) Applicants: Jay P. John, Chandler, AZ (US); James A. Kirchgessner, Tempe, AZ (US); Vishal P. Trivedi, Chandler, AZ (US)

(72) Inventors: Jay P. John, Chandler, AZ (US); James A. Kirchgessner, Tempe, AZ (US); Vishal P. Trivedi, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/157,308

(22) Filed: Jan. 16, 2014

(65) Prior Publication Data

US 2014/0131772 A1 May 15, 2014

Related U.S. Application Data

(62) Division of application No. 13/023,942, filed on Feb. 9, 2011, now Pat. No. 8,664,698.

(51) Int. Cl.
| | |
|---|---|
| H01L 29/737 | (2006.01) |
| H01L 29/08 | (2006.01) |
| H01L 29/10 | (2006.01) |
| H01L 29/165 | (2006.01) |
| H01L 29/45 | (2006.01) |
| H01L 29/66 | (2006.01) |
| H01L 29/732 | (2006.01) |
| H01L 29/06 | (2006.01) |

(52) U.S. Cl.
CPC ........ *H01L 29/7371* (2013.01); *H01L 29/0821* (2013.01); *H01L 29/1004* (2013.01); *H01L 29/165* (2013.01); *H01L 29/456* (2013.01); *H01L 29/66242* (2013.01); *H01L 29/66272* (2013.01); *H01L 29/732* (2013.01); *H01L 29/0649* (2013.01)

(58) Field of Classification Search
CPC .................. H01L 2924/00; H01L 2224/48091; H01L 2924/00014; H01L 2924/13055; H01L 2224/48247; H01L 29/732; H01L 29/74; H01L 29/7371
USPC ............. 257/197, E29.188, E21.371, E21.37, 257/173
See application file for complete search history.

(56) References Cited

U.S. PATENT DOCUMENTS

| | | | |
|---|---|---|---|
| 5,079,182 A | 1/1992 | Ilderem et al. | |
| 5,338,694 A | 8/1994 | Ilderem et al. | |
| 5,350,942 A | 9/1994 | Jerome et al. | |
| 5,466,960 A | 11/1995 | Ilderem et al. | |
| 7,611,955 B2 | 11/2009 | John et al. | |
| 2009/0065804 A1 | 3/2009 | Pagette et al. | |
| 2009/0321879 A1* | 12/2009 | John et al. | 257/587 |

* cited by examiner

*Primary Examiner* — Chuong A Luu
*Assistant Examiner* — Rodolfo Fortich
(74) *Attorney, Agent, or Firm* — Ingrassia Fisher & Lorenz, P.C.

(57) ABSTRACT

High frequency performance of (e.g., silicon) bipolar devices is improved by reducing the extrinsic base resistance Rbx. An emitter, an intrinsic base, and a collector are formed in a semiconductor body. An emitter contact has a region that overlaps a portion of an extrinsic base contact. A sidewall is formed in the extrinsic base contact proximate a lateral edge of the overlap region of the emitter contact. The sidewall is amorphized during or after formation so that when the emitter contact and the extrinsic base contact are, e.g., silicided, some of the metal atoms forming the silicide penetrate into the sidewall so that part of the highly conductive silicided extrinsic base contact extends under the edge of the overlap region of the emitter contact closer to the intrinsic base, thereby reducing Rbx. Smaller Rbx provides transistors with higher $f_{MAX}$.

19 Claims, 9 Drawing Sheets

SEMICONDUCTOR DEVICES WITH RECESSED BASE ELECTRODE

CROSS-REFERENCES TO RELATED APPLICATIONS

This is a divisional of co-pending U.S. application Ser. No. 13/023,942, filed Feb. 9, 2011.

FIELD OF THE INVENTION

This invention relates generally to semiconductor devices and, more particularly, to methods and structures for forming bipolar transistors and other semiconductor devices.

BACKGROUND OF THE INVENTION

For ultra-high frequency operation, e.g., in the 77 GHz auto radar band and above, transistors with very high $f_{MAX}$ (>250 GHz) and low high frequency noise are needed. Higher frequency bands, e.g., the 94+ GHz imaging band, will require even higher performance devices. While semiconductor devices employing III-V compounds are useful in these very high frequency bands, such devices are generally more expensive than is desired. A silicon based solution is desirable for ease of integration with other complex electronic functions and for low cost manufacturing. Self-aligned emitter-base silicon-germanium hetero junction bipolar transistors (HBTs) are potential candidates for such very high frequency devices, provided that current device performance limitations can be overcome. For example, the extrinsic base resistance Rbx is currently larger than desired and detracts from the overall device performance.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
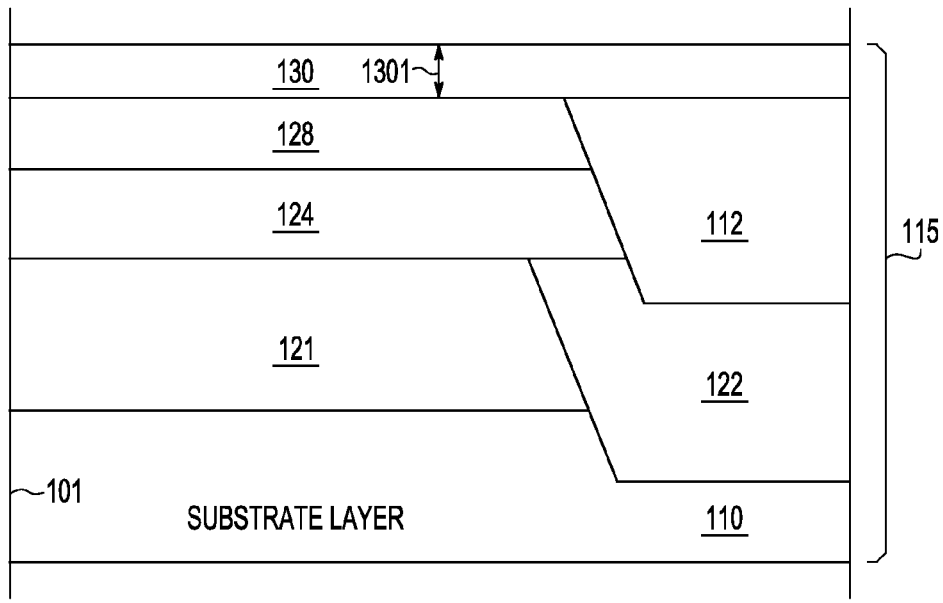
FIGS. 1-9 and 11-12 show simplified schematic cross-sectional views of a portion of a semiconductor device at various stages of manufacture according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Figure 8:
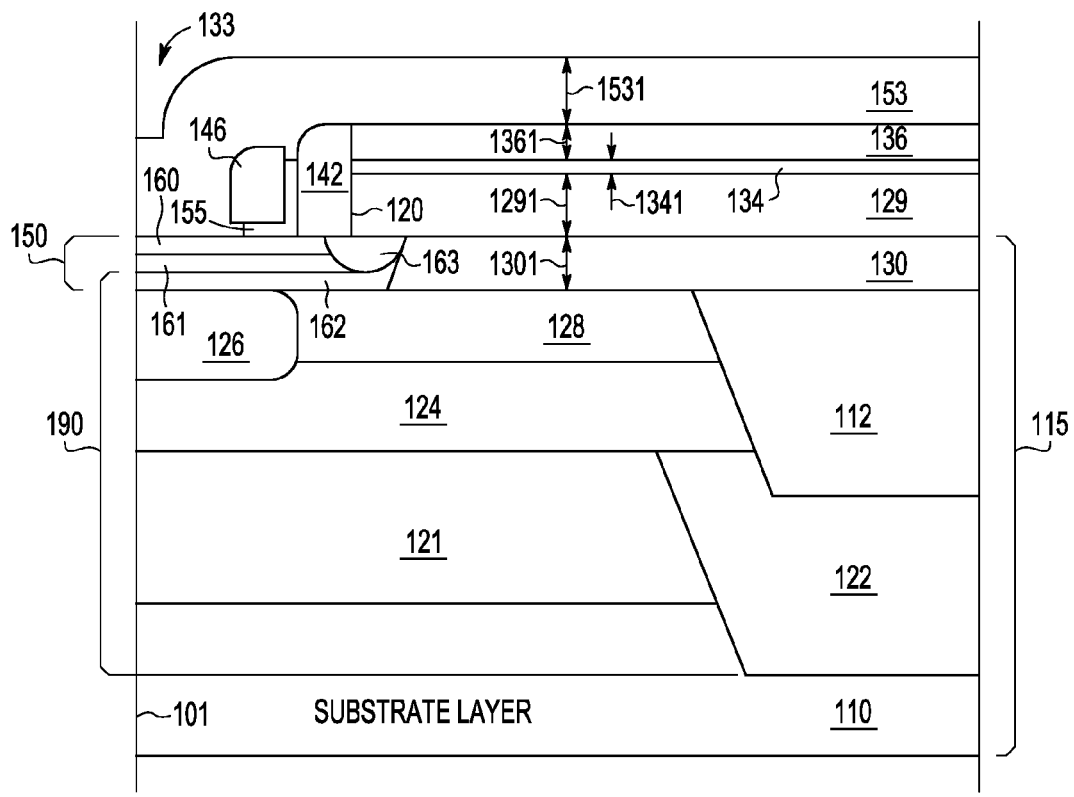
Figure 9:
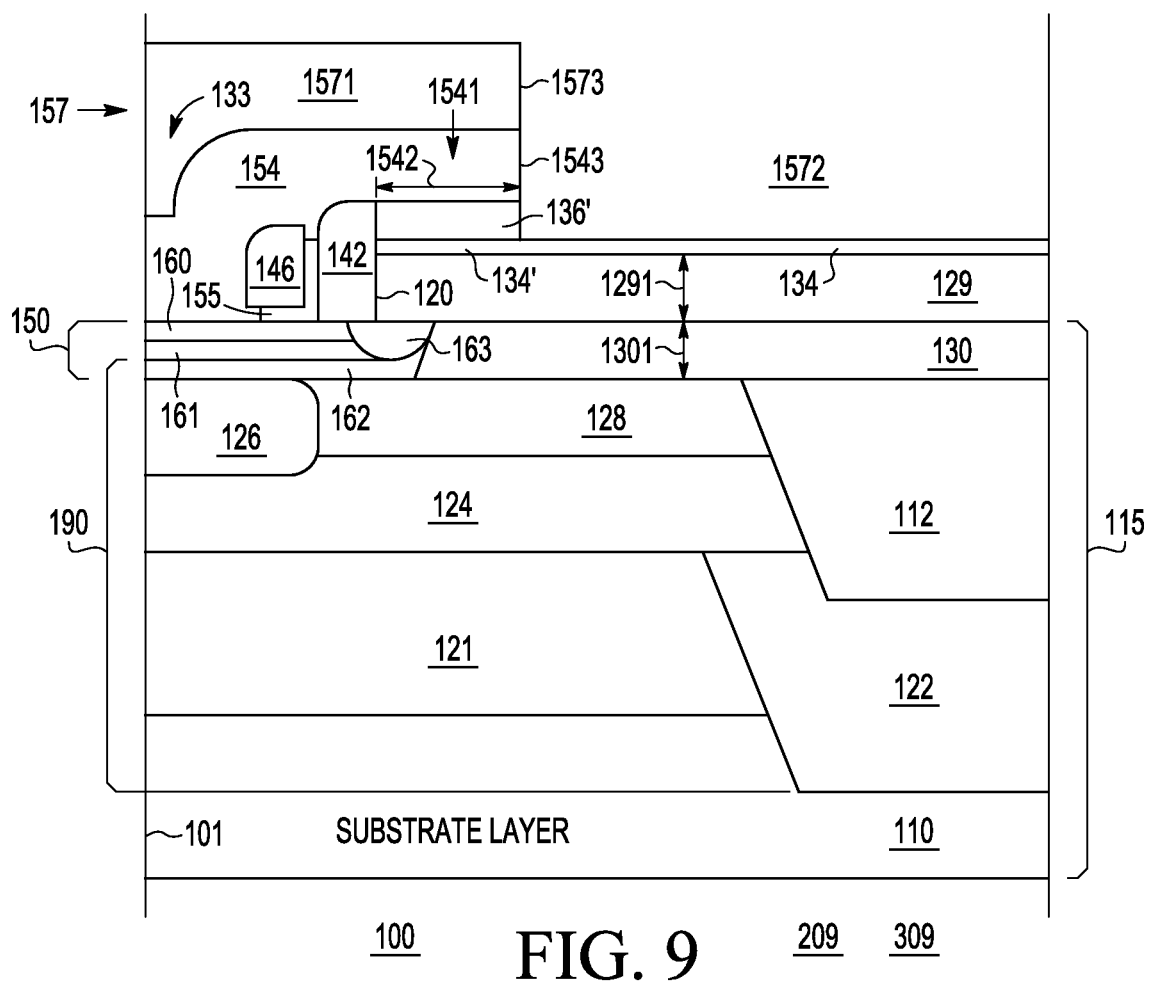
Figure 10:
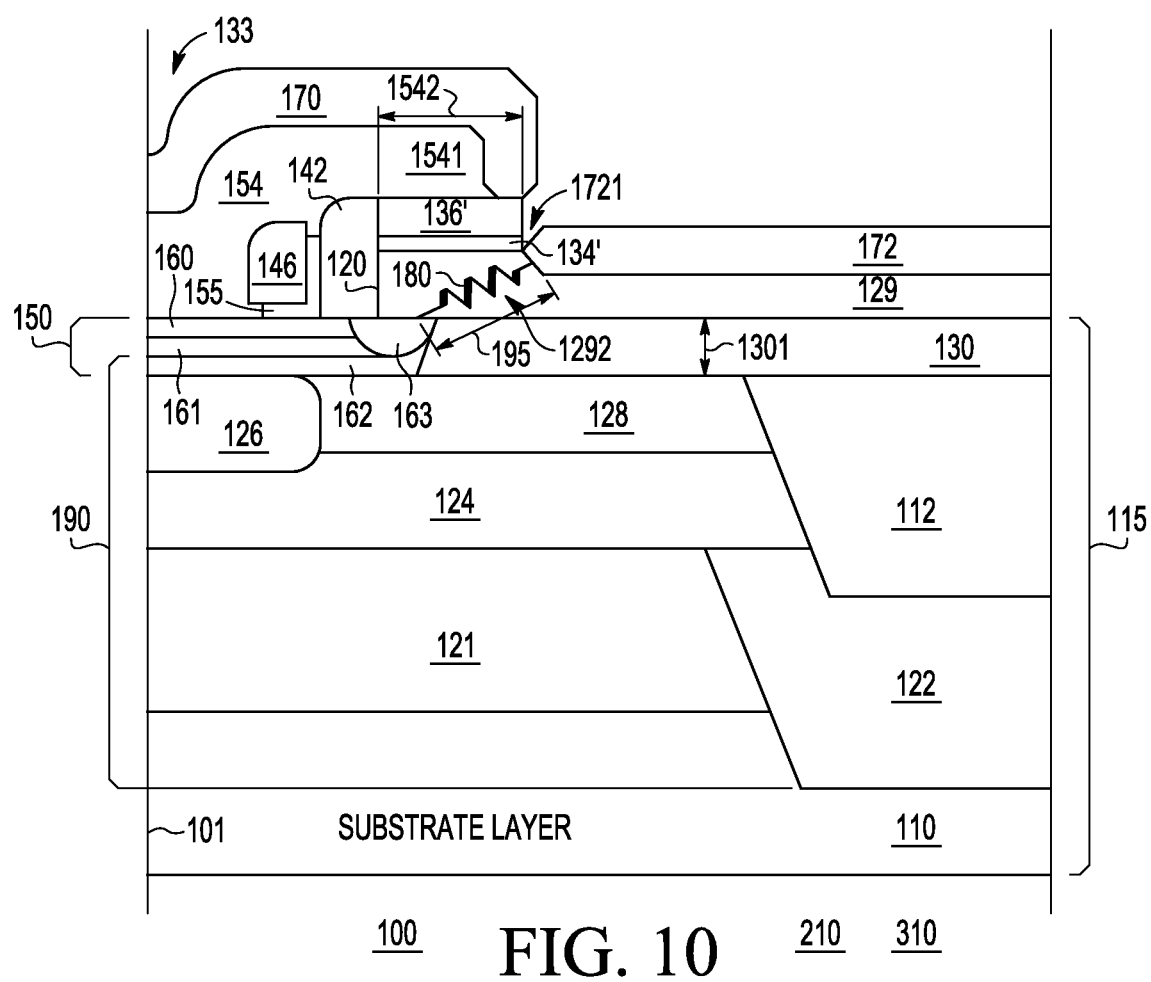
FIG. 10 shows a simplified schematic cross-sectional views of a portion of a semiconductor device subsequent to those of FIGS. 1-9 illustrating how higher than desired extrinsic base resistance can arise.

FIGS. 1-9 and 11-12 show simplified schematic cross-sectional views of a portion of semiconductor device 100 at various manufacturing stages 201-209 and 211-212, according to embodiments of the present invention and FIG. 10 shows a simplified schematic cross-sectional view of a portion of semiconductor device 100' at manufacturing stage 210 following stages 201-209 of FIGS. 1-9 illustrating how undesirable extrinsic base resistance can arise. It should be understood that semiconductor device 100 is merely exemplary and that the present invention may be manufactured using many different methods not specifically depicted or otherwise disclosed herein and that while device 100 is identified for convenience of explanation as a bipolar transistor, the various embodiments illustrated herein also apply to other types of semiconductor devices. Device 100 is generally symmetrical about cut line 101.

Referring now to initial manufacturing stage 201 of FIG. 1, the portion of device 100 therein can include semiconductor substrate layer 110. In one embodiment, substrate layer 110 can comprise a p-type bulk silicon wafer or an n-type bulk silicon wafer. In a different embodiment, substrate layer 110 can comprise other semiconductor materials besides silicon, such as silicon-germanium, germanium, gallium arsenide, other III-V compounds, II-VI compounds, further semiconductor materials both inorganic and organic, and combinations thereof. In another embodiment, substrate layer 110 can be a semiconductor-on-insulator (SOI) wafer having, for example, a first semiconductor or other substrate layer, a second semiconductor layer, and an electrical insulator layer located between the first and second layers. As used herein, the terms "substrate", "substrate layer" and "substrate layer 110" are intended to include all such variations and combinations.

In an embodiment, by way of example, for forming an npn device and not intended to be limiting, substrate layer 110 is a p-type substrate and includes a heavily doped n-type region 122, a heavily doped n-type region 121, a less-heavily doped n-type region 124, and a moderately-doped n-type region 128. Regions 121, 122, 124, 128 along with region 126 that may be added later in the manufacturing process (e.g., see FIG. 5-6), will eventually form part of collector region 190 (see FIG. 6) of a bipolar transistor or other terminal of other semiconductor devices. Various methods for forming regions 121, 122, 124, and 128 are well-known in the art and will not be further described herein. Isolation region 112, preferably of a dielectric material, is formed over a portion of region 122 and can be provided before forming regions 121, 122, 124, and 128, during their formation or after their formation. By way of example and not intended to be limiting, region 112 can be formed using a shallow trench isolation (STI) method, by a local oxidation of silicon (LOCOS) method, and by other methods well known in the art. For convenience of description and not intended to be limiting, the term "STI" is used in connection with region 112, but is intended to include the variations noted above and functional equivalents. After the formation of isolation region 112 and regions 121, 122, 124, and 128, dielectric layer 130 of thickness 1301 is formed over layer or region 128 and isolation region 112. Layer 130 is desirably an electrical insulating layer and can be formed by any number of well known techniques. Non-limiting examples are: growing a thermal oxide or depositing an insulating material such as an oxide, a nitride, an oxy-nitride or other dielectric by chemical vapor deposition (CVD). Non-limiting examples of other useful deposition means and methods comprise: (i) forming an oxide using TEOS (tetra-ethyl-ortho-silicate) or other reactants, and (ii) sputtering or evaporation of oxides, nitrides, oxy-nitrides and/or other dielectric materials. Growing and/or depositing a combination of insulating materials comprising one or more of any of the previously listed dielectric materials and other dielectric materials, using any of these preparation techniques may be used. Silicon oxide and silicon nitride are non-limiting examples of materials useful for dielectric layer 130. Silicon oxide is preferred. Thickness 1301 is usefully in the range of about 30 to 120 nanometers, more conveniently about 40 to 90 nanometers and preferably about 75 nanometers but thicker or thinner layers can also be used depending upon the desired device properties. Structure 301 results. The combination of substrate layer 110 and layers or regions 112, 121, 122, 124, 128 and 130 (including region 126 and 150 formed in connection with FIGS. 5 and 6) is referred to as semiconductor (SC) body 115.

Figure 2:
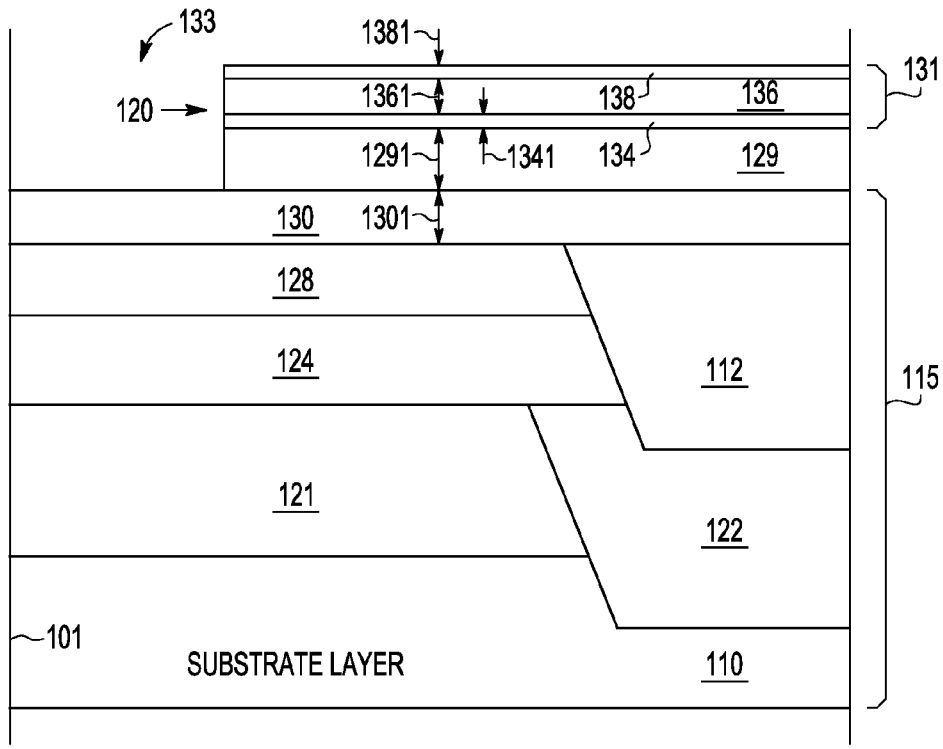

Referring now to manufacturing stage 202 of FIG. 2, base electrode layer 129 of thickness 1291 is formed over layer 130. As an example and not intended to be limiting, layer 129 can be formed by depositing a layer of amorphous or polycrystalline silicon over dielectric layer 130. Thickness 1291 is usefully in the range of about 20 to 200 nanometers, more conveniently about 50 to 150 nanometers and preferably about 120 nanometers, but thicker or thinner layers can also be used depending upon the desired device properties. In one embodiment, layer 129 can be deposited by a low-pressure chemical vapor deposition (LPCVD) method, but other well known methods may also be used in other embodiments. Where an NPN transistor is being fabricated, layer 129 can be heavily p-type doped in-situ, e.g., by ion implantation, or by thermal diffusion or by other means. In-situ doping, as that term is used herein, includes doping during formation of the layer, for example, using the same chamber or the same tool. If a PNP device is being fabricated, opposite conductivity (e.g., n-type) doping is preferably used for layer 129. In subsequent manufacturing stages, layer 129 will become the extrinsic base contract of transistor 100, 100' and is therefore from time to time also referred to as extrinsic base contact 129.

Oxide-nitride structure 131 is usefully formed over the layer 129. Structure 131 desirably includes oxide and nitride layers. In one embodiment, structure 131 desirably includes nitride layer 136 of thickness 1361 sandwiched between two oxide layers; oxide layer 134 of thickness 1341 and oxide layer 138 of thickness 1381, to form oxide-nitride-oxide (ONO) structure 131. As an example, silicon nitride layer 136 can be formed between two layers 134, 138 of an oxide formed using TEOS. Thickness 1341 is usefully in the range of about 5 to 100 nanometers, more conveniently about 10 to 30 nanometers and preferably about 15 nanometers, but thicker or thinner layers can also be used depending upon the desired device properties. Thickness 1381 is usefully in the range of about 5 to 100 nanometers, more conveniently about 10 to 30 nanometers and preferably about 15 nanometers, but thicker or thinner layers can also be used depending upon the desired device properties. Layer 136 of thickness 1361 can be formed by low-pressure chemical vapor deposition of silicon nitride over layer 134. Thickness 1361 is usefully in the range of about 20 to 150 nanometers, more conveniently about 40 to 100 nanometers and preferably about 70 nanometers, but thicker or thinner layers can also be used depending upon the desired device properties. Layer 138 is conveniently formed by depositing over layer 136 a layer of oxide formed using TEOS. In other embodiments, structure 131 can comprise an oxide layer formed over a nitride layer, a nitride layer formed over an oxide layer, two other dielectric layer stacks, an oxide layer sandwiched between two nitride layers, or three or more other dielectric layer stacks. While multi-layer dielectric structures 131 employing various dielectrics not limited merely to oxides and/or nitrides are useful, the above-described oxide-nitride-oxide (ONO) structure is preferred.

After depositing structure 131, layer 129 and structure 131 are patterned and etched to facilitate forming an emitter region in location 133 to the left of edge or boundary 120 of structure 131 and layer 129. In one embodiment, a masking layer (not shown) is formed over layer 138, having an opening corresponding to location 133. This masking layer (not shown) can be a photoresist mask or a hard-etch mask. An etching process then is used to sequentially etch layers 138, 136, 134, and 129 in location 133. As an example, a first reactive-ion-etch (RIE) process can be used to etch through a portion of layer 138 to form a first part of emitter location 133. Then, a second RIE etch process can be used to etch through a portion of layer 136 to form a second part of emitter location 133. Then a third RIE etch process, which can be similar to the first RIE etch process, can be used to etch through a portion of layer 134 to form a third part of emitter location 133. Finally, a fourth RIE etch process can be used to etch through a portion of layer 129 to form a fourth part of emitter location 133. The remaining portions of layers 129, 134, 136, 138 to the right of edge or boundary 120 underlying the etch mask (not shown) are substantially undisturbed. Structure 302 results.

Figure 3:
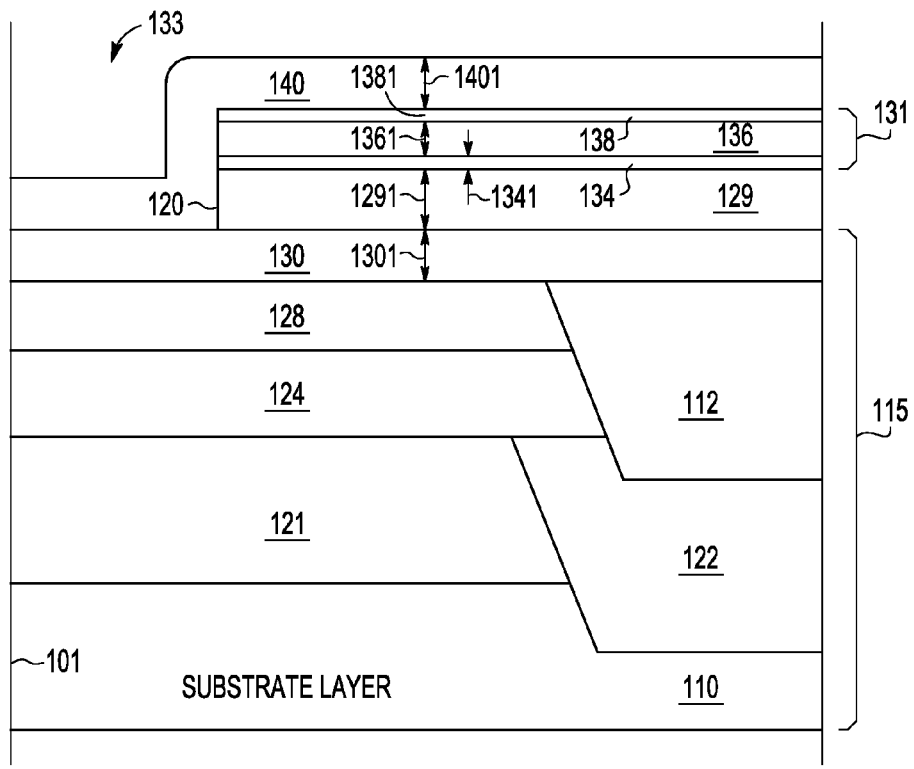

Referring now to manufacturing stage 203 of FIG. 3, insulating layer 140 of thickness 1401 is formed over layers 129 and 130 and structure 131. As a non-limiting example, layer 140 can be formed by low pressure chemical deposition (LPCVD) of silicon nitride. Thickness 1401 is usefully in the range of about 5 to 100 nanometers, more conveniently about 10 to 80 nanometers and preferably about 20 nanometers, but thicker or thinner layers can also be used depending upon the desired device properties. In the same or different embodiments, layer 140 is conveniently composed of the same material as layer 136, as for example, silicon nitride, but this is merely an example of a further embodiment and not intended to be limiting. Structure 303 results.

Figure 4:
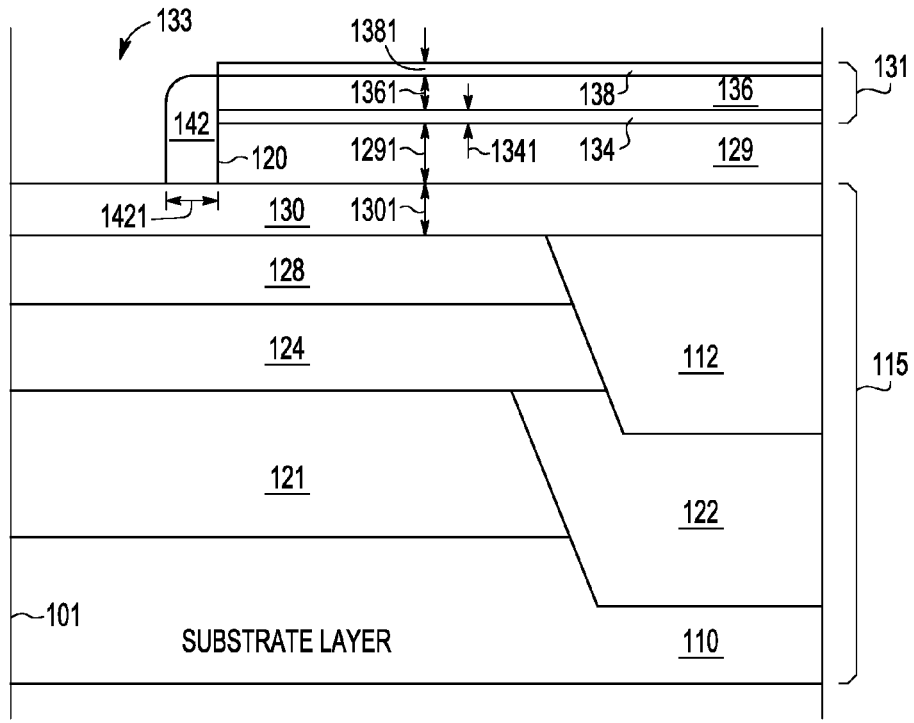

Referring now to manufacturing stage 204 of FIG. 4, spacer 142 is formed in location 133 adjacent to edge or boundary 120 of structure 131 and layer 129 by removing a portion of layer 140 formed in manufacturing stage 203 of FIG. 3. Among other things, spacer 142 seals sidewall edge or boundary 120 of layer 129 to prevent selective epitaxial growth on boundary or edge 120 in a later manufacturing step. Width 1421 of spacer 142 corresponds approximately to thickness 1401 and is desirably less than about 100 nanometers and preferably about 20 nanometers, but thicker or thinner layers can also be used depending upon the desired device properties. As a non-limiting example, layer 140 (see FIGS. 3-4) can be anisotropically etched to provide spacer 142. In one embodiment, layer 140 can be anisotropically etched using a dry etch process, preferably a selective etch process that stops on layers 130 and 138. Use of a mask is usually not required because of the anisotropic nature of the etchant and its selectivity. Selectivity means, for example, being able to etch the material of layer 140 while not significantly etching the materials of layers 130, 138. As an example, a reactive-ion-etch (RIE) process is preferably used to etch layer 140 to form spacer 142. Structure 304 results.

Figure 5:
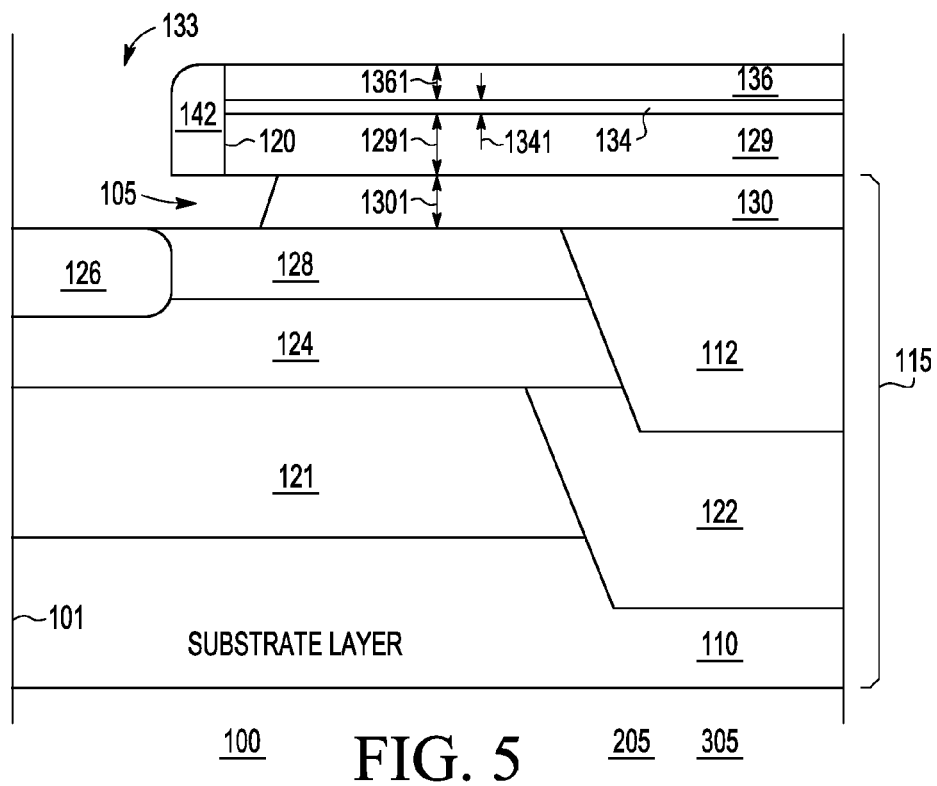

Referring now to manufacturing stage 205 of FIG. 5, layer 138 (see FIG. 4) and a portion of layer 130 are removed. In a preferred embodiment, these are both oxide layers and may be removed at the same time. The portion of layer 130 removed underneath spacer 142 and under left edge or boundary 120 of layer 129 forms cavity 105, thereby exposing a portion of region 128 and a portion of the underside of layer 129. As an example, layers 130 and 138 of silicon oxide (see FIG. 4) can be selectively wet etched by a hydrofluoric acid (HF) solution. As used herein, the term "selective etching" or "selectively etched" is intended to refer to reactions in which the materials being removed are etched while other materials that may also be exposed to the etchant(s) are not significantly attacked. Other reagents can be used when layers 130 and 138 are formed of other materials. The selective etching does not significantly attack (e.g. silicon) region 128 and (e.g., polysilicon) layer 129. In one embodiment, the removal of layer 138 and the portion of layer 130 near edge or boundary 120 can occur at the same time. Following the formation of cavity 105, regions 124 and 128 can be optionally locally doped (e.g., n type) in location 133 to form region 126. As an example, a selectively implanted collector (SIC) implant can be performed in a portion of regions 124 and 128 in location 133 to form region 126. As a further example, region 126 can be self-aligned by spacer 142 and layers 136, 134, 130, and 129. Doping regions 124 and 128 to form region 126 improves $f_T$ of device 100. However, excess dopants too close to the transistor base can undesirably increase the collector-base capacitance of the transistor and hence degrade both $f_T$ and $f_{MAX}$, which are defined respectively as: (i) $f_T$=the frequency where the short-circuit current gain=1, also referred to as the cut-off frequency or transit frequency, an intrinsic speed figure of merit, and (ii) $f_{MAX}$=the frequency where the unilateral power gain=1, also referred to as the maximum frequency of oscillation, a power gain figure of merit. In the same or a different embodiment, before implanting to provide region 126, an additional oxide layer may be deposited in cavity 105 and over layer 136 and region 128 in order to further reduce the collector-base capacitance. An additional etch can also be used in this embodiment, to remove the oxide layer after the implant. As an example, the additional oxide layer (not shown) can be formed by depositing and/or growing an approximately 75 nanometer thick layer of silicon dioxide over region 128 and layer 136 and in cavity 105. The oxide layer can be removed by performing, for example, a wet HF etch after doping regions 124 and 128 to form region 126. In another embodiment, instead of implanting after the formation of cavity 105, the implanting can be performed after the formation of spacer 142 and before the formation of cavity 105. In still another embodiment, this implantation to form region 126 can be omitted altogether. All these approaches are useful. Structure 305 results.

Figure 6:
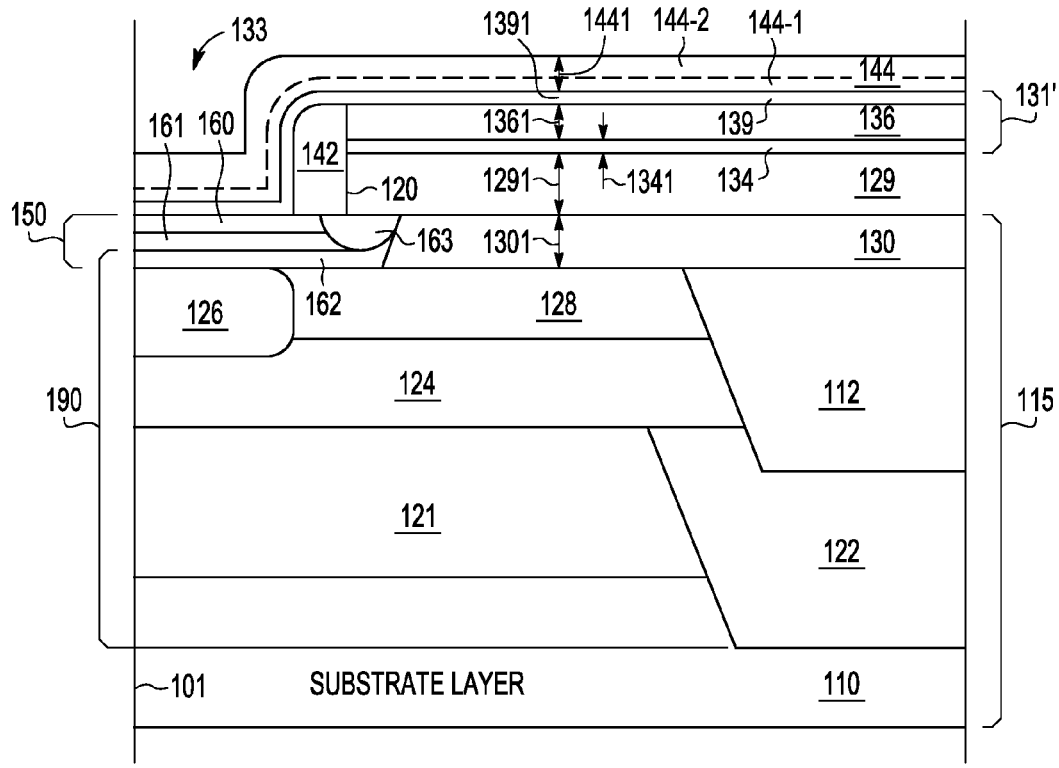

Referring now to manufacturing stage 206 of FIG. 6, epitaxial layer 150 is formed on regions 126 and 128. A portion of epi-layer 150 underlies spacer 142 and the left end of layer 129 proximate edge or boundary 120. Layer 150 couples together region 126 of collector region 190 and extrinsic base contact 129. In one embodiment, layer 150 is doped. As an example for an NPN device, a portion of layer 150 includes a boron dopant to form an intrinsic base region for an NPN device. In another embodiment, layer 150 can be a composite epitaxial layer. As a non-limiting example, layer 150 can be formed by the process of: (a) growing a silicon epitaxial layer 162 over regions 126 and 128; (b) growing a SiGeC (silicon-germanium-carbon) epitaxial layer 161 over layer 162; and (c) growing a silicon epitaxial layer 160 over layer 161. One or more of layers 160, 161, and 162 can be doped to form the intrinsic base region of transistor 100. The exact nature and manner of formation of epi-region 150 is not important to the present invention provided that some portion thereof forms the intrinsic base region of transistor 100, 100'. For convenience of explanation it is assumed hereafter that epi-region 150 comprises n-type region 162 in contact with n-type region 126 of collector region 190, p-type intrinsic base region 161, and n-type emitter region 160 in a stack-like arrangement. Region 160 may be n-doped during formation or afterward, for example, by out-diffusion from heavily doped emitter contact layer 153 of FIG. 8. In other embodiments, layer 150 can be a composite epitaxial layer formed by a combination of silicon, silicon germanium (SiGe), SiGeC, or other epitaxial semiconductor materials.

Semiconductor base transition region 163 of enhanced doping in contact with the left end of extrinsic base contact layer 129 is desirably formed during the formation of layer 150. In one embodiment, base transition region 163 is a non-single crystalline epitaxial region formed during the formation of layer 150 and doped by out-diffusion from polycrystalline or amorphous layer 129. In another embodiment, base transition region 163 is a portion of region 150, which is similarly doped by diffusion from layer 129 and/or doped during formation of layer 150. The combination of one or more of layers or regions 162, 128, 126, 124, 121, and 122 are also referred to as collector region 190 of bipolar transistor or other SC device 100, 100'. Depending on the desired electrical characteristics of the transistor or other SC device, any combination of one or more of these layers may be utilized with the present invention. For example, layer 162 may be omitted from collector region 190, or layer 126 and/or layer 124 may be omitted from collector region 190. All such variations are useful.

Dielectric layer 139 is desirably formed over spacer 142, layer 136 and layers 150 thereby providing ONO structure 131'. As an example, layer 139 of thickness 1391 can be formed by depositing an oxide formed using TEOS or other formation means. Thickness 1391 is usefully in the range of about 5 to 60 nanometers, more conveniently about 10 to 40 nanometers and preferably about 20 nanometers, but thicker or thinner layers can also be used depending upon the desired device properties. Spacer layer 144 of thickness 1441 is desirably deposited over layer 139. In one embodiment, amorphous silicon (a-Si) is deposited to form layer 144. In another embodiment, the a-Si layer is implanted with one or more (e.g., N+) dopants. In a further embodiment, the a-Si layer is doped in-situ. In yet another embodiment, layer 144 is formed by deposition of silicon nitride instead of a-Si. In still another embodiment, layer 144 can be an oxide-nitride stack. All such variations are useful. In a preferred embodiment, layer 144 comprises a first layer 144-1 of, for example, silicon nitride of about 20 nanometers thickness followed by a second layer 144-2 of, for example, silicon oxide of about 60 nanometers thickness, but other materials and thicker and thinner layers can also be used in other embodiments. CVD or LPCVD is a suitable method for forming the nitride layer and CVD or LPCVD or thermal decomposition of TEOS is suitable for forming the oxide layer. Structure 306 results.

Figure 7:
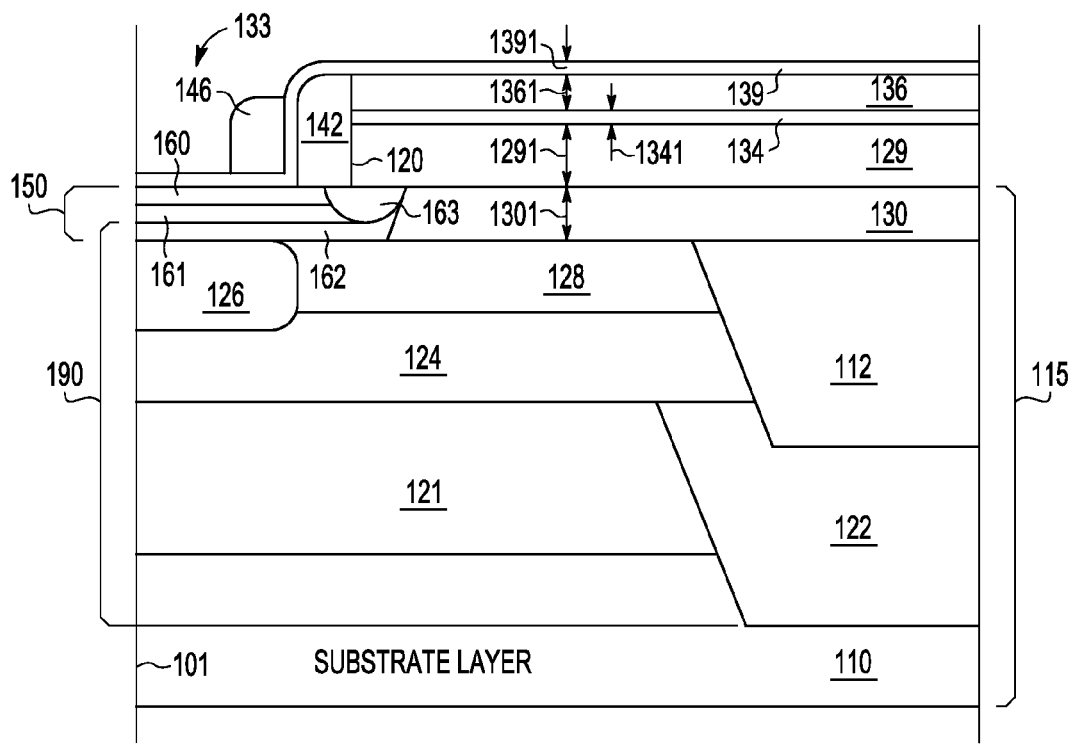

Referring now to manufacturing stage 207 of FIG. 7, part of layer 144 of FIG. 6 is desirable removed to form spacer 146. In one embodiment, layer 144 is anisotropically and/or selectively etched, for example using layer 139 as an etch stop, to form spacer 146. As an example, layer 144 can be etched using a RIE process to form spacer 146. There are many variations of spacer shapes that may be formed here, depending on the composition of layers 144 and 139. All such variations are useful. For example, if layer 144 comprises a first layer 144-1 of silicon nitride and a second layer 144-2 of silicon oxide, spacer 146 will be comprised of both nitride and oxide. The exact nature and manner of formation of spacer 146 is not important to the present invention but it is desirably included so that greater lateral spacing is maintained between (i) emitter electrode layer 153 formed in FIG. 8 (described below) and (ii) base transition region 163 and extrinsic base contact 129. Structure 307 results.

Referring now to manufacturing stage 208 of FIG. 8, spacer 155 is formed by removing part of (e.g., oxide) layer 139 of FIG. 7. In one embodiment, layer 139 is wet-etched to form spacer 155 using spacer 146 as a hard mask and spacer 142 and layers 136 and 150 as etch stop regions or layers. In another embodiment, spacer 155 is formed by anisotropically etching part of layer 139 before wet etching the rest of layer 139. Either arrangement is useful.

Emitter electrode layer 153 of thickness 1531 is formed over layers 136 and 150, and spacers 142, 146, and 155. Thickness 1531 is usefully in the range of about 20 to 200 nanometers, more conveniently about 60 to 120 nanometers and preferably about 100 nanometers, but thicker or thinner layers can also be used depending upon the desired device properties. In one embodiment, emitter electrode layer 153 is formed by depositing an in-situ doped amorphous or polysilicon layer that will be subsequently patterned and etched in manufacturing stage 209 of FIG. 9 to form emitter contact 154 (see FIG. 9). A hydrogen pre-bake is desirably performed for mono-emitters to eliminate any interfacial oxide layer between layer 153 (and eventual emitter contact 154 of FIG. 9) and layer 150, which also promotes epitaxial alignment of eventual emitter contact 154. In another embodiment, amorphous or polysilicon emitter electrode layer 153 can be deposited and then doped with ion implantation. Either arrangement is useful. The (e.g., n-type) dopants from the in-situ doping or implantation of amorphous or polysilicon emitter contact 154 of FIG. 9 will diffuse into layer 160, to form an emitter region. Structure 308 results.

Referring now to manufacturing stage 209 of FIG. 9, emitter electrode layer 153 and underlying portions of layer 136 are patterned and etched, e.g., using mask 157 having closed portion 1571 and open portion 1572, to form emitter contact 154 ohmically coupled to epitaxial region 150. Emitter contact 154 has overlap region 1541 above spacers 134', 136' of layers 134, 136 that are protected during etching by closed portion 1571 of mask 157 and overlap region 1541. Emitter contact 154 is laterally separated by spacers 146, 142, 155 and vertically separated by spacers 136', 134' from the extrinsic base contact provided by conductive layer 129, also referred to as extrinsic base contact 129. In general, lateral width 1542 of overlap region 1541 by which emitter contact 154 extends to the right beyond left edge or boundary 120 of extrinsic base contact 129 should be equal or larger than the minimum alignment accuracy of the manufacturing process being used. Selective etching is preferably used: (i) to remove those portions of emitter contact layer 153 and dielectric (e.g., nitride) layer 136 not protected by mask 157, and (ii) to stop etching upon reaching (e.g., oxide) dielectric layer 134 so that dielectric layer 134 is temporarily left in place. Dielectric regions 136' and 134' underlie overlap region 1541 and closed portion 1571 of mask 157, and vertically separate overlap region 1541 of emitter contact 154 from extrinsic base contact 129. In a still further embodiment, an additional (e.g., boron) implant into that part of layer 129 to the right of edge 1573 of mask 157 may be performed at this stage to increase the doping at the surface of layer 129. This can reduce subsequent metal-semiconductor contact resistance. Structure 309 results.

FIG. 10 shows a simplified schematic cross-sectional view of a portion of semiconductor device 100' following from manufacturing stages 201-209 of FIGS. 1-9, illustrating how higher than desired extrinsic base resistance can arise. In manufacturing stage 210 of FIG. 10, dielectric (e.g., oxide) layer 134 to the right of edge 1573 of mask 157 (or distal edge 1543 of emitter contact 154) shown in FIG. 9 is removed and, after removal of mask 157, the doped semiconductor of emitter contact 154 and extrinsic base contact 129 are exposed, for example, to a highly conductive metal(s) or equivalent to form metal-semiconductor alloy (e.g., silicide) regions 170, 172, thereby reducing the resistance of contacts 154 and 129. The metal-semiconductor alloy is much more conductive than what can be achieved merely by doping contacts 154, 129. Use of a metal-semiconductor alloy (e.g., a silicide) significantly reduces the resistance of emitter contact 154 and extrinsic base contract 129. As used herein in connection with metal-semiconductor alloys including but not limited to silicides, the term "metal" is intended to include any conductor that forms an alloy with a semiconductor that is significantly more conductive than what can be achieved merely by substitutionally doping the semiconductor with impurity atoms. However, even though such conductive metal-semiconductor alloys are employed in regions 170, 172 of FIG. 10, undesirable extrinsic base resistance 180 (see FIG. 10) can still exist where base current must flow through non-silicide or non-alloyed portion 1292 of layer 129 between left end 1721 of silicide or alloy region 172 and doped base transition region 163 in contact with intrinsic base 161 of transistor 100'.

Figure 11:
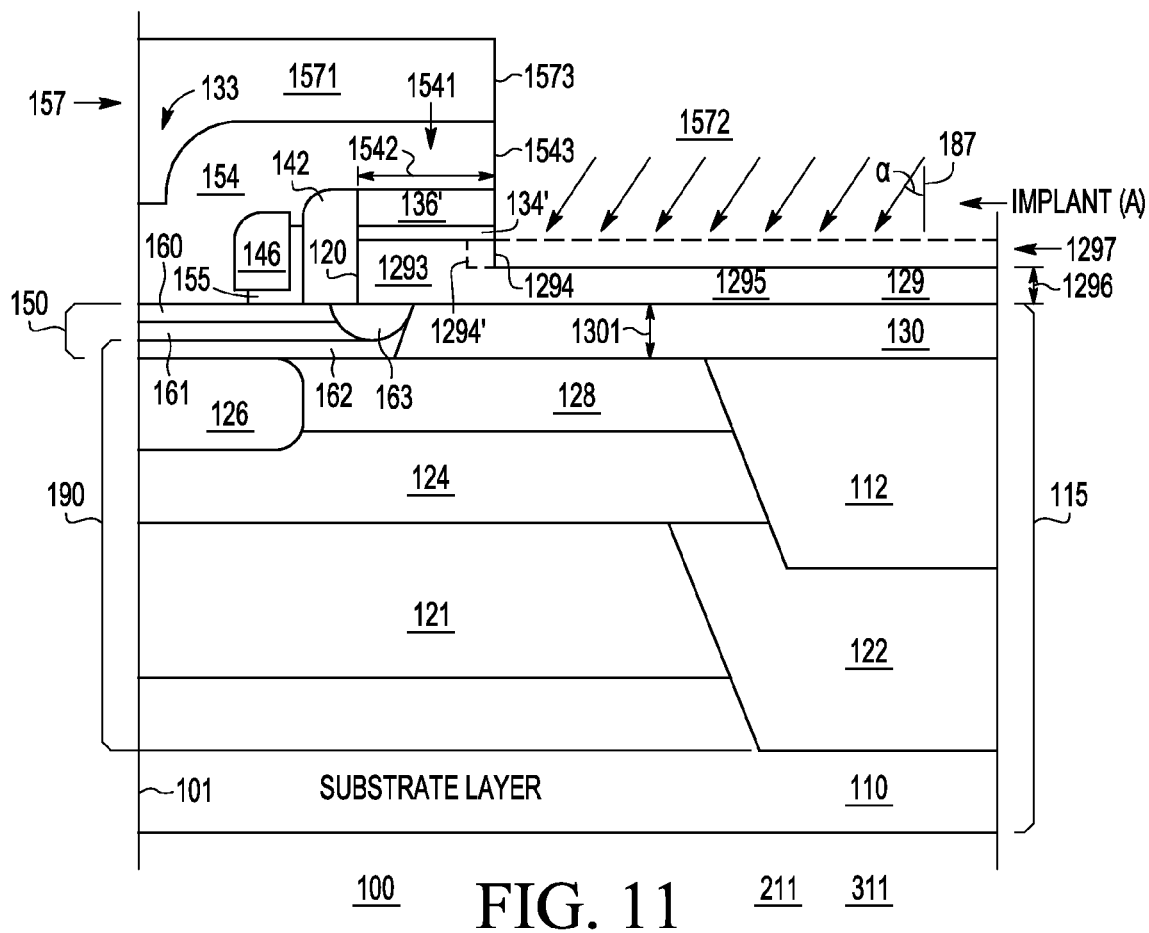

Manufacturing stage 211 of FIG. 11 follows from manufacturing stage 209 and structure 309 of FIG. 9, and illustrates how undesirable extrinsic base resistance 180 illustrated in FIG. 10 can be significantly reduced. In an exemplary embodiment of manufacturing stage 211 of FIG. 11, mask 157 that was used to define emitter contact overlap region 1541 in manufacturing stage 209 of FIG. 9, is conveniently left in place and structure 309 etched to first remove the portion of dielectric (e.g., oxide) layer 134 not protected by closed portion 1571 of mask 157 and then etch away part 1297 of extrinsic base contact layer 129, leaving in place: (i) portion 1293 of initial thickness 1291 (see FIG. 2) of layer 129 underlying and to the left of distal edge 1543 of emitter contact overlap region 1541, and (ii) portion 1295 of reduced thickness 1296 of layer 129 over layer 130 laterally to the right of distal edge 1543 of emitter contact overlap region 1541. Structure 311 results, in which portion 1293 of extrinsic base contact layer 129 has exposed sidewall 1294 proximate distal edge 1543. Sidewall 1294 may substantially underlie distal edge 1543 of emitter contact overlap region 1541 or may be somewhat recessed to the left of distal edge 1543 of overlap region 1541 as indicated by sidewall 1294', depending upon the degree to which the etchant used on extrinsic base contact layer 129 acts anisotropically (e.g., yielding sidewall 1294) or isotropically (e.g., yielding sidewall 1294'). In the figures that follow it is assumed that etching of layer 129 was substantially anisotropic resulting in the sidewall of portion 1293 being located as shown for sidewall 1294 in FIG. 11. However, either location is useful, and the term "at or near edge 1543" or "proximate edge 1543" or equivalent when referring to sidewall 1294 or sidewall 1294' or both is intended to include either of the locations shown in FIG. 11 or any other location in the general vicinity of edge 1543.

In manufacturing stage 212 of FIG. 12, emitter contact 154 and the exposed portions of extrinsic base contact 129 including edge 1294, and portion 1295 of FIG. 11 are coated with a deposited metal (e.g. by sputtering) and annealed to form a relatively low resistance metal-SC alloy (e.g., a silicide) regions 180, 182 analogous to regions 170, 172 discussed in connection with FIG. 10. Metal-SC alloy region 180 overlies emitter contact 154 and metal-SC alloy region 182 overlies remaining portion 1295' (if any) of extrinsic base contact 129 and has portion 183 that extends under overlap region 1541 into region 1293 (see FIG. 11) of extrinsic base contact 129, as is explained more fully below. Because of the existence of alloy region 183 extending from sidewall 1294 (or 1294'), unalloyed region 1293' of FIG. 12 underlying overlap region 1541 is smaller than unalloyed regions 1293 of FIG. 11. Structure 312 results.

It is found that if the surface of extrinsic base portions or sidewall 1293, 1294, 1294', 1295 have a substantially amorphous rather than crystalline or polycrystalline structure, that such metal-semiconductor alloy (e.g., a silicide) is more readily formed, especially on sidewall 1294 (or 1294') and penetrates to a greater extent both laterally and vertically into extrinsic base portions or sidewall 1293, 1294, 1294' 1295 shown in FIG. 11. The presence of sidewall 1294 (or 1294') (see FIG. 11) permits the metal atoms used to form the metal-semiconductor alloy regions 180, 182 (e.g., silicide or equivalent) to migrate and penetrate laterally by distance 185 (see FIG. 12) toward left edge or boundary 120 of extrinsic base contact 129, thereby forming extrinsic base metal-semiconductor alloy (e.g., silicide) contact 182 having region 183 thereof beneath overlap region 1541 of emitter contact 154. In this way, resistance 184 in remaining region 1293' of FIG. 12 between the leftward edge of alloyed region 183 of extrinsic base contact 129, 182 and doped base transition region 163 is much less than resistance 180 of region 1292 of FIG. 10. Thus, the overall extrinsic base resistance is reduced and the overall performance of device 100 of FIG. 12 is improved compared to device 100' of FIG. 10.

As is noted above, it has been found that the tendency of silicide (or equivalent metal-semiconductor compound) to form on sidewall 1294 (or 1294') underneath emitter contact overlap region 1541 is enhanced by amorphizing the sidewall 1294 (or 1294') of portion 1293 of extrinsic base contact layer 129. This can be accomplished in several ways of which two are described below. The terms "amorphizing", "amorphization", "amorphized" and the like mean "rendering amorphous" or "to have rendered amorphous".

According to one embodiment, one or both of the deposition temperature $T_D$ and/or the deposition pressure $P_D$ for extrinsic base contact layer 129 formed in manufacturing stage 202 of FIG. 2 are reduced. For example, where silicon is used to form layer 129, in order to promote formation of substantially amorphous rather than polycrystalline material for layer 129, deposition at pressures in the range of about $P_D \geq 0.1$ Torr are useful, about $P_D \geq 1$ Torr are convenient and about $1 \leq P_D \leq 80$ Torr are preferred, and/or deposition temperatures of about $T_D \geq 510$ degrees Celsius are useful, about $T_D \geq 550$ degrees Celsius are convenient, and about $550 \leq T_D \leq 590$ degrees Celsius are preferred. In other embodiments, both $T_D$ and $P_D$ may be reduced to promote formation of an amorphous rather than a crystalline or poly-crystalline semiconductor material for extrinsic base contact layer 129. Persons of skill in the art will understand that there are many combinations of pressure and temperature that can be used to deposit primarily amorphous rather than crystalline or polycrystalline semiconductor layers and any such combination is useful.

In another embodiment, deposition of layer 129 in manufacturing stage 202 of FIG. 2 may be initially made at temperatures and/or pressures that favor formation of a polycrystalline layer and then the exposed surface of such layer and particularly sidewall 1294 (or 1294') amorphized prior to formation of a silicide (or equivalent metal-semiconductor compound) thereon. In a preferred embodiment, amorphization can take place after etching of layer 129 in manufacturing stage 211 of FIG. 11 and prior to, e.g., siliciding, in manufacturing stage 212 of FIG. 12. It has been found that this may be accomplished, for example, by bombarding the exposed surface of portions 1293, 1295 (including sidewall 1294 or 1294') of extrinsic base layer 129 with substantially inert gas atoms of sufficient energy to break up the structure of such crystalline or polycrystalline surface. Such bombardment is indicated, for example, in manufacturing stage 211 of FIG. 11 by IMPLANT (A). Xe is an example of a suitable gas for this purpose, but other gases that do not interfere with subsequent silicide formation (or equivalent metal-semiconductor compound)) may also be used. Ion implantation is an example of a suitable means of delivering the Xe or other bombardment atoms or ions, but other means of delivering atoms or ions of sufficient energy may also be used and the term IMPLANT (A) as used herein is intended to include such variations. For polycrystalline silicon layers it has been found that Xe energies in the range of about 50 to 150 keV are useful, with about 80 to 120 keV being convenient and about 110 keV being preferred, but higher or lower energies may also be used. Xe implant doses in the range of about 1E14 to 4E15 atoms cm$^{-2}$ are useful, doses in the range of about 4E14 to 2E15 atoms cm$^{-2}$ are convenient, and doses of about 1E15 atoms cm$^{-2}$ are preferred, but higher and lower doses and other implant ions may be used in other embodiments depending upon the amount of amorphization desired.

In order to facilitate amorphization of sidewall 1294 (or 1294') under emitter contact overlap region 1541, it is desirable that such bombardment or implant be made at angle α with respect to normal 187 to the surface of layer 1295, with the implant direction inclined as illustrated with respect to sidewall 1294 (or 1294'). Angle α is usefully in the range of about 0<α degrees, more conveniently in the range of about $5 \leq \alpha \leq 90$ degrees, and preferably about $10 \leq \alpha \leq 90$ degrees. Persons of skill in the art will understand that to facilitate amorphization of sidewalls 1294 (or 1294') of multiple devices 100 that may have different azimuthal orientations on the wafer in which they are being formed, it is desirable that the amorphizing implant be done at multiple azimuthal orientations.

Where emitter contact 154 and extrinsic base contact 129 comprise silicon, then $CoSi_2$ and $NiSi_2$, PtSi and/or NiPtSi are non-limiting examples of suitable silicides for layers or regions 180, 182. When for example and not intended to be limiting, poly-silicon or amorphous silicon contacts 154, 129 are exposed to atoms or molecules of Co or Ni or Pt and/or NiPt, the silicon and cobalt, nickel or platinum or combinations thereof react in place, thereby converting portions of contacts 154, 129 to highly conductive silicide layers or regions 180, 182. Sputtering is a preferred method for depositing Co, Ni, Pt, NiPt, etc., to form silicides or equivalent. Other well known deposition techniques can also be used. Chemical vapor deposition (CVD) is a non-limiting example of a suitable alternate technique. In an exemplary embodiment and not intended to be limiting, sputtering onto polysilicon contacts 154, 129, 1293, 1294, 1295, etc., of FIGS. 11-12 of about 1 to 50 nanometers of cobalt (Co) is useful, about 4 to 30 nanometers of Co is convenient and about 8 to 15 nanometers of Co is suitable. By way of example and not intended to be limiting, other metals such as those noted above may also be used. The sputtering usefully occurs at substrate wafer temperatures of about 20 to 300 degrees Celsius, more conveniently about 100 to 200 degrees Celsius and preferably at or above about 150 degrees Celsius. Sputtering is conveniently carried out in argon at a pressure of about 7 milli-Torr but higher and lower pressures and other inert gases can also be used. In some embodiments, the Co may be capped with a titanium nitride (TiN) layer having usefully about 1 to 50 nanometers of TiN, more conveniently about 4 to 30 nanometers of TiN and suitably about 15 nanometers of TiN. This is desirable to improve thermal stability and reduce sensitivity to contaminants in some embodiments. The sputtered metal layers are reacted with the underlying amorphous silicon of contacts or sidewall 154, 129, 1293, 1294, 1295, etc., by usefully annealing at about 350 to 850 degrees Celsius for about 5 to 120 seconds in nitrogen or other substantially inert gas, more conveniently at 400 to 500 degrees Celsius for about 20 to 60 seconds and suitably at about 450 degrees Celsius for about 30 seconds. Other atmospheres or vacuum may also be used. A brief wet etch is then desirably performed to remove any un-reacted Co or other alloying metal (and the TiN cap layer if present) and a further anneal performed at about 350 to 900 degrees Celsius for about 5 to 120 seconds usefully provided, more conveniently at about 750 to 850 degrees Celsius for about 30 to 90 seconds and suitably at about 800 degrees Celsius for about 60 seconds. The cobalt or other alloying metal reacts with the amorphous silicon or other semiconductor in emitter contact 154 and extrinsic base contact and/or sidewall 129, 1293. 1294, 1294', 1295 to form silicide (or other alloy) layers or regions 180, 182 of FIG. 12.

Figure 12:
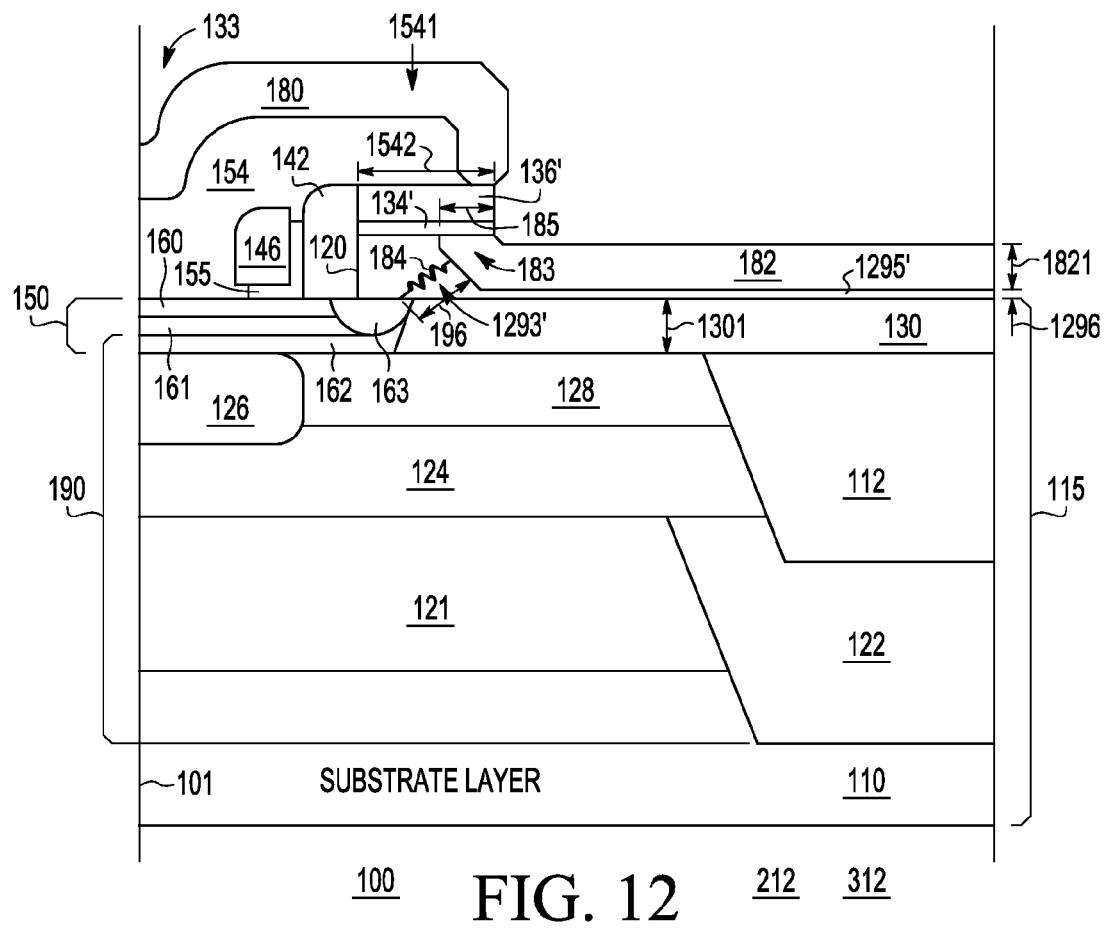

Table I below shows measured results for the base resistance Rb and the frequency of unity power gain $f_{MAX}$ for "Recessed Base" structure 312 of FIG. 12 compared to measured results for otherwise equivalent "Standard Base" structure 310 of FIG. 10 with substantially similar emitter width.

TABLE I

MEASURED DEVICE RESULTS

| TEST SAMPLE | Rb (Ohms) | $f_{MAX}$ (GigaHertz) |
|---|---|---|
| STANDARD BASE (No sidewall silicide) | 16.2 | 300 |
| RECESSED BASE (With sidewall silicide) | 15.4 | 320 |
| RECESSED BASE (No sidewall silicide) | 21.6 | 210 |

It will be readily apparent that the "Recessed Base" structure with silicide region 183 on sidewall 1294 (e.g., as illustrated in FIG. 12) provides at least 5-7% improved performance compared to otherwise equivalent "Standard Base" structure 310 of FIG. 10. In addition to the measured results presented above, a theoretical analysis of the two structures indicates that improvements greater than 10% should be achievable. Such improvements are very significant in permitting device operation at higher and higher frequencies, to meet demands for devices capable of operation at such frequencies. The important part played by sidewall silicide region 183 underlying overlap region 1541 on Recessed Base structure 312 of FIG. 12 is illustrated in the third data line of Table I. The third data line of Table I shows that when sidewall silicide region 183 is omitted, the base resistance is higher and the $f_{MAX}$ is significantly lower.

Figure 13:
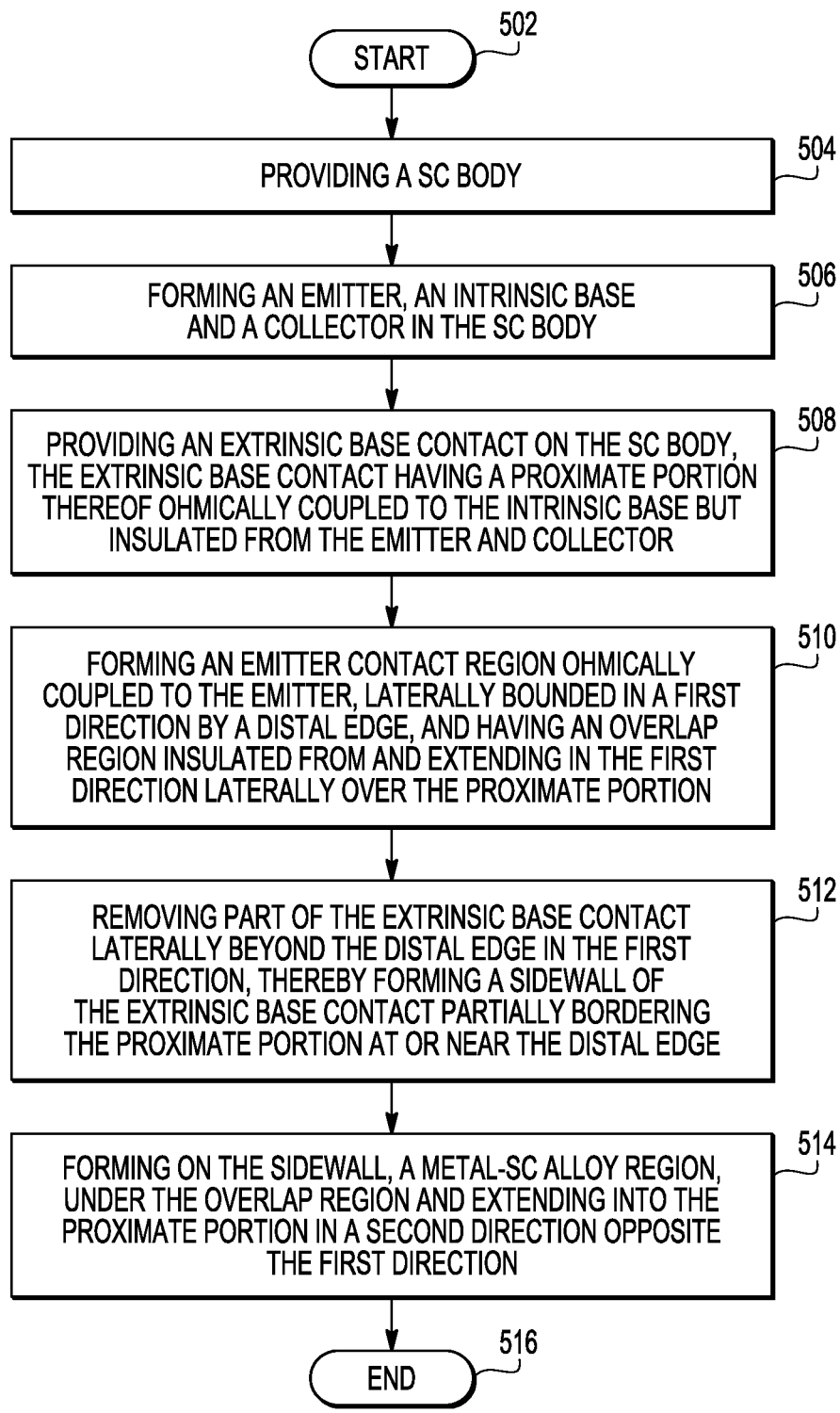
FIG. 13 illustrates a flow chart for a method of manufacturing a semiconductor device having reduced extrinsic base or other connection resistance, according to a further embodiment of the present invention.

FIG. 13 illustrates a flow chart for method 500 of manufacturing a semiconductor device (100) having reduced base resistance. Method 500 begins with START 502 and initial step 504 wherein a semiconductor (abbreviated as "SC") body (115) is provided, as for example is illustrated in FIG. 1. In subsequent step 506, an emitter (160), an intrinsic base (161) and a collector (190) are formed in the SC body (115), as is illustrated for example in FIGS. 2-6. In step 508, an extrinsic base contact (129) is provided on the SC body (115), the extrinsic base contact (129) having a proximate portion (1293) thereof ohmically coupled to the intrinsic base (161, 163) but insulated from the emitter (160) and the collector (190), as is illustrated for example, in FIGS. 2-6. In step 510, an emitter contact region (154) is formed, ohmically coupled to the emitter (160), laterally bounded in a first direction by a distal edge (1543), and having an overlap region (1541) insulated from and extending in a first direction laterally over the proximate portion (1293), as is illustrated for example, in FIGS. 8-9. In step 512, part (1295) of the extrinsic base contact (129) laterally beyond the distal edge (1543) in the first direction is removed, thereby forming a sidewall (1294, 1294') of the extrinsic base contact (129) partially bordering the proximate portion (1293) at or near the distal edge (1543), as is illustrated for example, in FIG. 11. In step 514, an electrically conductive metal-semiconductor (e.g., a silicide or the like) alloy region (183) is formed on the sidewall (1294, 1294') under the overlap region (1541) and extending into the proximate portion (1293) in a second direction opposite the first direction, as is illustrated for example in FIG. 12. Method 500 then proceeds to END 516. In an exemplary embodiment, a mask (157) is conveniently used to define the emitter contact region (154) and the overlap region (1541) thereof and is also used as a mask during step 512 wherein part (1297) of the extrinsic base contact (129) is removed. In another embodiment, the overlap region (1541) of the emitter contact region (154) is used as a mask in the step wherein part (1297) of the extrinsic base contact (129) is removed. In a still further embodiment, in step 514 wherein an electrically conductive metal-semiconductor (e.g., a silicide or the like) alloy region (183) is formed on the sidewall (1294, 1294') under the overlap region (1541) and extending into the proximate portion (1293) in a second direction opposite the first direction, the same electrically conductive metal-semiconductor alloy is also formed on the emitter contact region (154), as is illustrated in FIG. 12. In a yet further embodiment, one or more sidewall spacers (120, 146, 155) may be provided prior to forming the emitter contact region (154), as is illustrated for example, in FIGS. 3-4 and 6-7. Persons of skill in the art will understand that following manufacturing stage 212 of FIG. 12 and step 514 of FIG. 13, that further conductive interconnections and protective encapsulants may be applied, that the substrate may be singulated into individual die or integrated circuits (and optionally mounted into a protective package) to provide a finished product, using means well known in the art. Although the invention has been described with reference to specific embodiments and in the context of a bipolar transistor, it will be understood by those skilled in the art that various changes may be made without departing from the spirit or scope of the invention, including forming other types of semiconductor devices. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that regions or layers 129, 130, 134, 136, 138, 139, 144, 153, 154, 180, 182, 183, etc., may be comprised of many different material and formed by many different methods, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

According to a first embodiment, there is provided a method (201-209, 211-212, 500) for forming a semiconductor device (100), comprising, providing a semiconductor (SC) body (115), forming an emitter (160), a base (161, 163) and a collector (162, 190) in the SC body (115), forming a base contact (129) on the SC body (115), the base contact (129) having a proximate portion (1293) thereof ohmically coupled to the base (161, 163), forming an emitter contact (154) ohmically coupled to the emitter (160) and having an overlap region (1541) extending over the proximate portion (1293), removing part (1297) of the base contact (129) beyond the overlap region (1541) thereby forming a sidewall (1294, 1294') in the base contact (129) bordering the proximate portion (1293), and forming in the sidewall (1294, 1294'), a metal-semiconductor alloy region (183) extending into the proximate portion (1293) under the overlap region (1541). According to a further embodiment, the semiconductor body (115) comprises silicon and the metal-semiconductor alloy region (183) comprises a silicide. According to a still further embodiment, the step of forming an emitter (160), a base (161) and a collector (162, 190) comprises forming a hetero junction emitter-base region (150). According to a yet further embodiment, a mask (157) is used to define the emitter contact (154) and the overlap region (1541) thereof and the method further comprises, using substantially the same mask (157) during the step of removing part (1297) of the base contact (129). According to a still yet further embodiment, the step of removing part (1297) of the base contact (129) comprises, using the overlap region (1541) as a mask during the step of removing part (1297) of the base contact (129). According to a yet still further embodiment, the method further comprises prior to formation of the emitter contact (154), forming one or more sidewall spacers (120, 146, 155) adapted to laterally separate the emitter contact (154) from the base contact (129). According to another embodiment, the step of forming on the sidewall (1294, 1294'), a metal-semiconductor alloy region (183) extending into the proximate portion (1293) under the overlap region (1541), occurs in part at or above about 100 degrees Celsius. According to a still another embodiment, the step of forming on the sidewall (1294, 1294'), a metal-semiconductor alloy region (183) extending into the proximate portion (1293) under the overlap region (1541) further comprises, annealing at about 350 to 850 degrees Celsius for at least 5 seconds in a substantially inert gas; and then etching to remove any un-reacted metal; and then further annealing at about 350 to 900 degrees Celsius for at least 5 seconds. According to a yet another embodiment, prior to the step of forming on the sidewall (1294, 1294'), a metal-semiconductor alloy region (183) extending into the proximate portion (1293) under the overlap region (1541), the method further comprises, amorphizing part of the proximate portion (1293) adjacent the sidewall (1294, 1294').

According to a second embodiment, there is provided a semiconductor (SC) device (100), comprising, an emitter (160), a base (161) and a collector (162, 190), a base contact (129) ohmically coupled to the base (161, 163), wherein the base contact (129) has a sidewall (1294, 1294') therein separated from the base (161, 163) by a first portion (1293) of the base contact, and wherein the base contact (129) has a second portion (1295) extending beyond the sidewall (1294, 1294'), an emitter contact (154) having a peripheral region (1541) overlapping the first portion (1293) of the base contact (129), and a metal-semiconductor material (183, 182) extending under the peripheral region (1541) from the sidewall (1294, 1294') in the first portion (1293) of the base contact (129). According to a further embodiment, a part of the first portion (1293) of the base contact (129) underlying the overlap region (1541) is amorphized prior to formation of the metal-semiconductor material (183, 182) therein. According to a still further embodiment, the metal-semiconductor material (183, 182) comprises a semiconductor reacted with one or more of Co, Ni, Pt, NiPt or a combination thereof. According to a yet further embodiment, a metal for forming the metal-semiconductor material (183, 182) is deposited at a temperature equal or greater than about 100 degrees Celsius. According to a still yet further embodiment, the metal-semiconductor material (183, 182) is annealed after deposition at a temperature exceeding the deposition temperature. According to a yet still further embodiment, the sidewall (1294, 1294') is substantially amorphous. According to another embodiment, the sidewall (1294, 1294') is rendered amorphous by ion bombardment prior to formation of the metal-SC material (182, 183) thereon.

According to a third embodiment, there is provided a method (201-209, 211-212, 500) for forming a bipolar transistor, comprising, forming an emitter region (160), a base region (161, 163) and a collector region (162, 190) in or on a semiconductor body (115), providing a base contact (129), ohmically coupled to the base region (161, 163), the base contact (129) having a first portion (1293) proximate the base region (161, 163), and a second portion (1295) separated from the first portion (1293) by a sidewall (1294, 1294'), forming an emitter contact (154) on the emitter region (160), the emitter contact (154) having an overlap region (1541) overlapping the first portion (1293) of the base contact (129), and forming a metal-semiconductor compound (183, 182) in the base contact (129), including underlying at least part of the overlap region (1541) from the sidewall (1294, 1294'). According to a further embodiment, the method further comprises, prior to formation of the metal-semiconductor compound (183, 182), amorphizing the sidewall (1294, 1294'). According to a still further embodiment, amorphizing the sidewall (1294, 1294') comprises bombarding the sidewall (1294, '1294') with inert gas ions. According to a yet further embodiment, bombarding the sidewall (1294, 1294') comprises implanting inert gas atoms into the sidewall (1294,

1294') using an angled implant at an angle α>0 with respect to a normal (187) to a surface of the base contact (129).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A semiconductor device, comprising:
an emitter, a base, and a collector;
a base contact ohmically coupled to the base, wherein the base contact has a sidewall therein separated from the base by a first portion of the base contact, wherein the base contact has a second portion extending beyond the sidewall, and wherein the sidewall is formed by partially etching away the base contact during fabrication of the semiconductor device;
an emitter contact having a peripheral region overlapping the first portion of the base contact;
a metal-semiconductor material extending under the peripheral region from the sidewall in the first portion of the base contact; and
a dielectric layer overlying the first portion of the base contact, the sidewall extending from the base contact to the dielectric layer in a substantially vertical direction.

2. The device of claim 1, wherein a part of the first portion of the base contact underlying the overlap region is amorphized prior to formation of the metal-semiconductor material therein.

3. The device of claim 2, wherein the metal-semiconductor material comprises a semiconductor reacted with one or more of Co, Ni, Pt, NiPt or a combination thereof.

4. The device of claim 3, wherein a metal for forming the metal-semiconductor material is deposited at a temperature equal or greater than about 100 degrees Celsius.

5. The device of claim 4, wherein the metal-semiconductor material is annealed after deposition at a temperature exceeding the deposition temperature.

6. The semiconductor device of claim 1, wherein the sidewall is substantially amorphous.

7. The semiconductor device of claim 6, wherein the sidewall is rendered amorphous by ion bombardment prior to formation of the metal-SC material thereon.

8. A semiconductor device, comprising:
a semiconductor (SC) body;
an emitter formed in the SC body;
a base formed in the SC body;
a collector formed in the SC body;
a base contact formed on the SC body and having a proximate portion thereof ohmically coupled to the base, the base contact having a sidewall bordering the proximate portion;
a dielectric layer overlying the proximate portion of the base contact, the sidewall extending from the base contact to the dielectric layer in a substantially vertical direction;
an emitter contact ohmically coupled to the emitter and having an overlap region extending over the proximate portion; and
a metal-semiconductor alloy region extending into the proximate portion under the overlap region.

9. The device of claim 8, wherein the semiconductor body comprises silicon and the metal-semiconductor alloy region comprises a silicide.

10. The device of claim 8, further comprising a hetero junction emitter-base region formed at least in part by the emitter and the base.

11. The device of claim 8, wherein the overlap region of the emitter contact has a distal edge, and wherein the sidewall of the base contact substantially underlies the distal edge.

12. The device of claim 8, wherein the overlap region of the emitter contact has a distal edge, and wherein the sidewall of the base contact is recessed within respect to the distal edge.

13. The device of claim 8, the sidewall of the base contact has a substantially amorphous structure.

14. A semiconductor device, comprising:
an emitter region, a base region, and a collector region formed in or on a semiconductor body;
a base contact ohmically coupled to the base region, the base contact comprising:
a first portion proximate the base region;
a second portion separated from the first portion; and
a substantially vertical sidewall located at a juncture between the first and second portions and formed by removal of material from the base contact during fabrication of the semiconductor device;
an emitter contact formed on the emitter region and having an overlap region overlapping the first portion of the base contact; and
a metal-semiconductor compound formed in the base contact and underlying at least part of the overlap region.

15. The device of claim 14, wherein the overlap region of the emitter contact has a distal edge, and wherein the substantially vertical sidewall of the base contact substantially underlies the distal edge.

16. The device of claim 14, wherein the overlap region of the emitter contact has a distal edge, and wherein the substantially vertical sidewall of the base contact is recessed within respect to the distal edge.

17. The device of claim 14, wherein the base contact has an inner terminal edge underlying the overlap region of the emitter contact, and wherein the first portion of the base contact is located between the inner terminal edge and the substantially vertical sidewall of the base contact.

18. The device of claim 14, wherein the substantially vertical sidewall of the base contact has a substantially amorphous structure, and wherein the metal-semiconductor compound comprises metal atoms penetrating into the first portion of the base contact through the substantially vertical sidewall.

19. The device of claim 14, wherein the first portion of the base contact has a thickness greater than the second portion of the base contact.

* * * * *